United States Patent [19]
Stone

[11] Patent Number: 6,132,583
[45] Date of Patent: Oct. 17, 2000

[54] SHIELDING METHOD AND APPARATUS FOR USE IN ELECTROPLATING PROCESS

[75] Inventor: William M. Stone, Norton, Mass.

[73] Assignee: Technic, Inc., Pawtucket, R.I.

[21] Appl. No.: 08/857,772

[22] Filed: May 16, 1997

[51] Int. Cl.[7] .............................. C25D 5/00; C25D 17/00
[52] U.S. Cl. ................ 205/96; 204/230.2; 204/230.3; 204/297 R; 204/DIG. 7; 205/125; 205/136
[58] Field of Search ............................ 205/96, 97, 125, 205/136; 204/224 R, 228, DIG. 7, 297 R, 297 W, 230.2, 230.3

[56] References Cited

U.S. PATENT DOCUMENTS

| | | | |
|---|---|---|---|
| 3,880,725 | 4/1975 | Van Raalte et al. | 205/95 |
| 4,534,832 | 8/1985 | Doiron, Jr. | 205/96 |
| 4,879,007 | 11/1989 | Wong | 205/137 |
| 5,401,370 | 3/1995 | Kauper et al. | 204/228.2 |

*Primary Examiner*—Kathryn Gorgos
*Assistant Examiner*—William T. Leader
*Attorney, Agent, or Firm*—Wolf, Greenfield & Sacks, P.C.

[57] ABSTRACT

An electroplating system includes a tank that holds an electrolytic bath solution. An anode within the tank receives a first voltage having a first potential. A substrate cathode, immersible in the solution within the tank, spaced from the anode, receives a second voltage having a second potential, opposite to that of the first potential. A shield is immersible in the solution within the tank between the anode and cathode. The level of shielding provided by the shield is variable and controllable. In one embodiment, the shield includes a conductive element that receives a third voltage having the first potential, the magnitude of the third voltage being controllable. In another embodiment, the shield includes at least one louver, the physical orientation of which is controllably adjustable. The shield is sufficiently spaced from the substrate cathode to be substantially outside an area of sparging and is fixed between the anode and cathode. In an embodiment of the electroplating system, the substrate cathode is movable in horizontal directions toward and away from the anode while the shield is stationary in such horizontal directions.

17 Claims, 5 Drawing Sheets

SHIELDING METHOD AND APPARATUS FOR USE IN ELECTROPLATING PROCESS

FIELD OF THE INVENTION

The present invention relates generally to the field of electrolytic plating ("electroplating") and, more particularly, to improved shielding methods and devices for use in electroplating.

BACKGROUND OF THE INVENTION

Electroplating is a widely used process by which a layer of conductive material, typically a metal, is deposited onto at least one surface of a substrate. In many applications, such as in the fabrication of multi-layered printed circuit boards, it is desirable to evenly deposit the material onto the substrate surface(s) such that it will have a uniform thickness.

Electroplating involves immersing a substrate (i.e., circuit board) into an electrolytic bath between conductive anode walls (i.e., sidewalls of an anode "basket" structure) contained within a tank. The bath typically includes a conductive solution. Conductive material to be deposited on the substrate, such as nickel or copper nuggets, are located in close proximity of the anode walls.

During the process, a positive voltage is applied to the anode walls and a negative voltage is applied to the substrate (which acts as a cathode). In the fabrication of printed circuit boards, a layer of conductive material (from which traces may be etched through a photoresist process) typically is formed on the board, before the board undergoes electroplating. This conductive layer enables the printed circuit board to serve as a cathode.

When power is provided, a voltage drop is created between each anode and the substrate cathode. Positive ions (positively charged molecules) of the to-be-deposited material (i.e., copper, in the case of a printed circuit board) are formed within the solution. The ions are attracted to the cathode and repelled from the anodes, causing movement of the ions from the anodes to the cathode substrate through the solution. In this manner, the material is deposited onto exposed surfaces of the substrate.

In the fabrication of a circuit board, "through holes" are formed within (through) the board before the electroplating process. It is desired during electroplating that the conductive material not only be evenly deposited on the surfaces of the board, but also on the exposed surfaces within the through holes. Thus, boards typically are moved back and forth toward and away from each anode within the bath solution to cause the solution, and contained copper ions, to flow through the holes. It is particularly important in the electroplating of circuit boards that the deposited copper layer attain a uniform thickness.

A number of natural phenomena occur in the electroplating process which cause the material to be deposited unevenly on the substrate. For one, each ion has an associated weight. Thus, gravity causes the ions to fall within the tank as they migrate from the anodes to the cathode substrate. In addition, charge build-up tends to occur at edges of the cathode substrate causing a greater concentration of material deposition to occur in these areas. The fact that some substrates (which have different lengths) may not extend in length to the bottom of the tank further increases the concentration of material deposition occurring at the bottom edges of such substrates.

Much effort has been devoted towards minimizing the effects of such phenomena and factors so that even deposition is achieved. One common approach includes placing physical barriers, called "shields", between the anodes and cathode substrate adjacent substrate areas (such as the bottom edge, for example) where the deposition concentration tends to be higher. The shields offer a high resistance path to the material ions from anodes to cathode. Other approaches, typically used in conjunction with the shield approach, include (1) "sparging", which involves injecting bubbles (i.e., of air) into the solution in the immediate vicinity of the substrate cathode and, (2) physically agitating (setting in motion) the bath solution, both of which approaches tend to cause a more even material deposition.

Another approach involves reducing the voltage applied across the anodes and cathode, which voltage reduction tends to yield a more uniform deposition. The voltage reduction approach, however, also significantly slows down the process, particularly when the reduction is substantial, rending such approach infeasible in high volume circuit board manufacturing, where minimizing throughput time is of critical importance.

One prior art shielding approach is that described in U.S. Pat. No. 4,879,007 to Wong, titled Shield for Plating Bath, assigned to Process Automation International Limited, issued on Nov. 7, 1989 (hereinafter "the PAIL" patent). The PAIL patent approach includes forming holes within sidewalls of a floating panel positioner, which positioner retains the bottom edge of each circuit board substrate within an electroplating bath substrate and moves the retained circuit boards back and forth (toward and away from each anode wall). The sidewalls offer a high-resistance path to the migrating ions as they physically can pass only through the holes or must migrate around (i.e., over) the sidewalls. The sidewalls are spaced slightly from (located in close proximity of), and extend upwardly only a short distance from the bottom edge of, each circuit board. The sidewalls therefore act to shield ions only from a bottom area of the circuit board.

While the PAIL patent device is generally effective at limiting the commonly increased deposition concentration at and near the bottom edges of circuit boards, the approach suffers from a number of drawbacks. With sparging, bubbles can get trapped in small-pitched circuit board traces, which trapped bubbles block the flow of material ions, causing an uneven material deposition in such areas. In the PAIL patent approach, due to the close proximity between the shields and circuit board, the shield intersects and breaks up some sparging bubbles. In addition, the shield tends to move the bubbles toward and into contact with the circuit board, resulting in an increased number of bubbles that get trapped.

Another drawback of the PAIL patent approach includes what is referred to as the "trilobe" effect. When ions pass through each shield hole, they tend to spread out in a conical fashion due to their electrical attraction to the cathode circuit board. The overlap of ions emanating from any three adjacent shield holes causes a greater material deposition concentration in the overlapping areas. The result is referred to as the "trilobe effect" and is shown in FIG. 1. Shown is material 10 deposited on a substrate from ions passing through three adjacent shield holes. The deposited material forms three overlapping round areas 12, 14 and 16, each round area being formed from ions passing through a different one of the three adjacent holes. In the illustrative example shown, an area of overlap 18 has an increased material deposition concentration.

In an electroplating process, the area of overlap between adjacent holes, if any, depends primarily on the spacing of the holes, the distance between the shield and the circuit board, and the magnitude of voltage applied, as well as other factors. If overlapping occurs, then a greater concentration of deposited material occurs in the areas of overlap, as shown. If overlapping does not occur leaving spaces between the round deposited areas 12, 14 and 16, then areas will be left with a lesser concentration of deposited material. As a result, the material is not uniformly deposited. The fixed distance between the circuit board and the shields in the PAIL patent approach only exacerbates the problem because areas of overlap remain in the same locations, causing a continuous build-up in such areas during the electroplating process.

One further significant drawback of the PAIL patent device, and of other prior art shielding approaches, results from the fact that the shields are fixed in size and location with respect to the circuit board. Circuit boards, by contrast, vary in size. As a result, shielding which may be ideal for one board of a particular size is less than satisfactory for a board of a different size.

A general object of the present invention is to provide an improved electroplating shielding method and device which avoids the drawbacks of the prior art.

SUMMARY OF THE INVENTION

One embodiment of the invention is directed to an electroplating system. The system includes a tank for holding an electrolytic bath solution. An anode within the tank receives a first voltage having a first potential. A substrate cathode is immersible in the solution within the tank. The cathode is movable in both horizontal directions toward and away from the anode. The substrate cathode receives a second voltage having a second potential, opposite to that of the first potential. A shield is immersible in the solution within the tank, spaced from the anode and substrate cathode. The shield is stationary in the horizontal directions.

In an embodiment, the shield is located closer to the anode than the substrate cathode.

In an embodiment, the shield is retained by a glide bar movable only in vertical directions into and out from the tank. In this embodiment, the substrate cathode is retained by a panel positioner bar moveable in the horizontal directions and the vertical directions.

In an embodiment, the glide bar is buoyant and is retained within the solution by a downward force of the panel positioner bar.

In an embodiment, the shield is spaced sufficiently from the substrate cathode such that the shield is substantially outside an area of sparging.

In an embodiment, the shield includes a non-conductive plate having holes formed therein.

In an embodiment, the shield includes at least one louver. In this embodiment, a physical orientation of the louver is controllably adjustable.

In an embodiment, the shield includes a conductive screen element that receives a third voltage having the first potential. In this embodiment, the magnitude of the third voltage is controllable.

Another embodiment of the invention is directed to an electroplating system. The system includes a tank for holding an electrolytic bath solution. An anode within the tank receives a first voltage having a first potential. A substrate cathode is immersible in the solution within the tank, spaced from the anode. The substrate cathode receives a second voltage having a second potential, opposite to that of the first potential. A shield is immersible in the solution within the tank between the anode and the substrate cathode. A level of shielding provided by the shield is variable and controllable.

In an embodiment, the shield includes a conductive element that receives a third voltage having the first potential. The magnitude of the third voltage is controllable externally of the tank.

In one embodiment, the third voltage is pulse on and off.

In an embodiment, the shield includes at lease one louver, a physical orientation of the louver being controllably adjustable.

Another embodiment of the invention is directed to a shielding method for use in an electroplating system. The system includes a tank that holds an electrolytic bath solution. An anode is located at least partially in the solution within the tank. A substrate cathode is immersible in the solution within the tank, spaced from the anode. The method comprises the steps of: immersing a shield in the solution within the tank between the anode and substrate cathode; and controlling a level of shielding provided by the shield.

In an embodiment, the step of controlling includes a step of controlling a voltage applied to a conductive shield.

In an embodiment, the step of controlling includes a step of controlling a physical orientation of at least one louver.

The features and advantages of the present invention will be more readily understood and apparent from the following detailed description of the invention, which should be read in conjunction with the accompanying drawings and from the claims which are appended to the end of the detailed description.

BRIEF DESCRIPTION OF THE DRAWING

For a better understanding of the present invention, reference is made to the accompanying drawings, which are incorporated herein by reference and described briefly immediately below.

DETAILED DESCRIPTION

The present invention is directed to improved electroplating shielding devices and methods. Described below is a general electroplating system, in which any electroplating shield may be employed. Three different general shielding approaches, exemplary of those employable in the system, also are described. Each of the approaches described also may be used in any electroplating system, not only with the one described herein.

Figure 1:
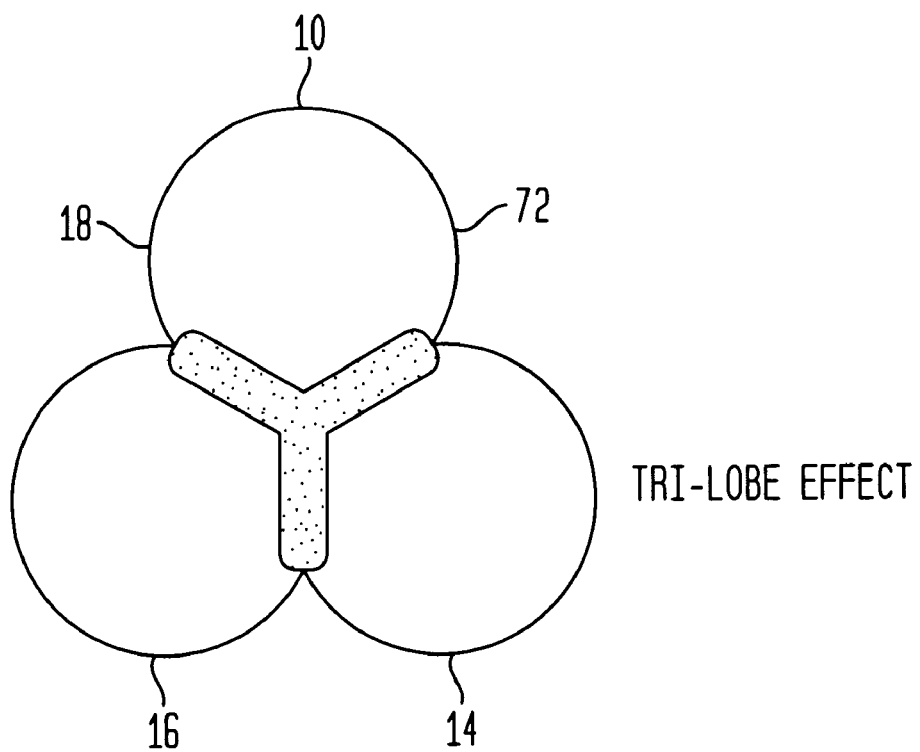
FIG. 1 is a diagram showing prior art electroplating deposition, particularly illustrating the trilobe effect.
Figure 2:
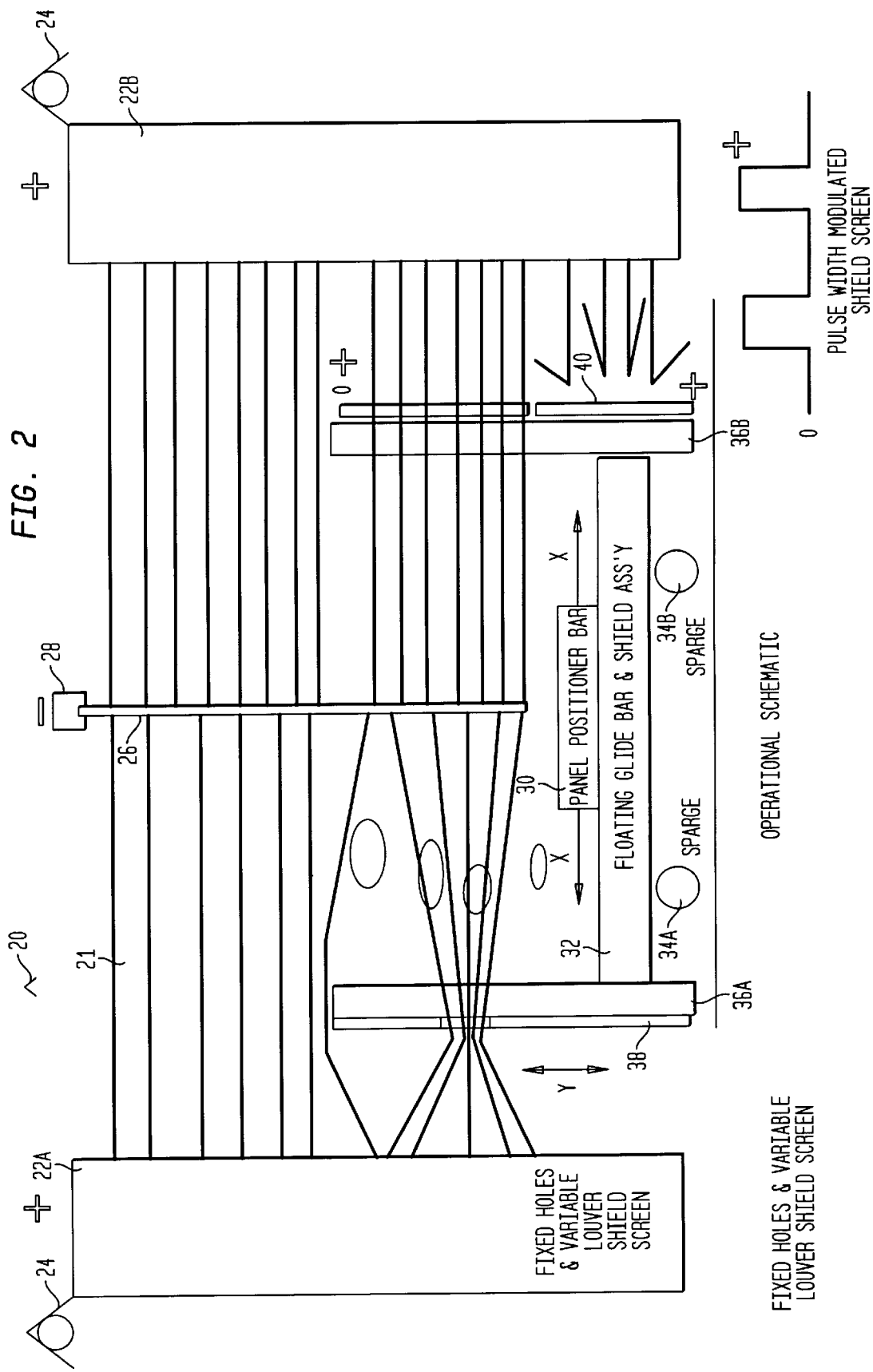
FIG. 2 is a general block diagram of an electroplating device according to an embodiment of the invention.

An electroplating system, according to one embodiment of the invention, in which any shielding device (such as one of the three shield approaches described hereinafter) may be employed, is shown in FIG. 2. As shown, an electroplating tank 20 holds a bath solution 21. An anode basket includes spaced anode walls 22A and 22B located at least partially within the tank and immersed within the solution. Anode walls 22A and 22B receive a voltage having a first potential (such as a positively charged voltage) from electrical lines 24, electrically connected to each anode wall. A floating glide bar and shield assembly 32, movable only in either of the two directions into and out from the tank, parallel to the longitudinal axes of the anode walls (referred to herein as the "vertical" directions, but may not be vertical in every system arrangement). At least one substrate 26 (i.e., circuit board), on which material is to be deposited, is attached at a bottom portion thereof to a panel positioner bar 30. Panel positioner bar 30, with attached substrate 26, is immersed within solution 21 and forced downwardly against an upper surface of floating glide bar 32 causing floating glide bar 32 to be retained against its buoyancy within solution 21.

Substrate 26 is retained by an electrically conductive clamp 28 at a top portion thereof. Clamp 28 is attached to a flight bar (not shown) which is movable to immerse the substrate within the solution. A negative voltage is applied to substrate 26 through clamp 28.

Figure 3:
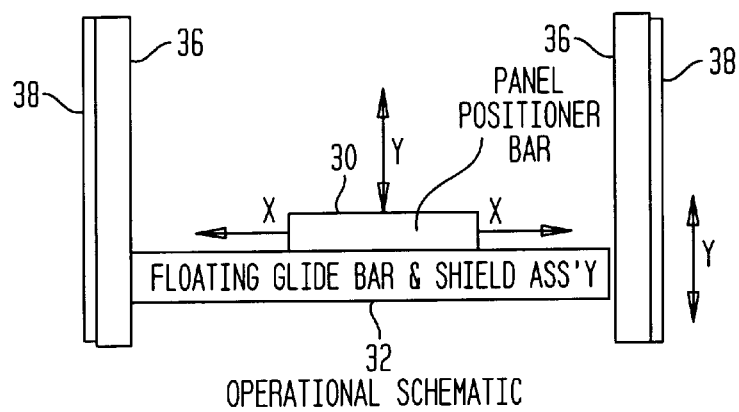
FIG. 3 is a functional block diagram of a portion of the electroplating device of FIG. 2 according to an embodiment of the invention.

Once immersed, panel positioner bar 30 is moved back and forth in both directions X toward and away from each anode wall, perpendicular to the longitudinal axes of the anode walls (referred to herein as the "horizontal" directions, but not necessarily horizontal in every system arrangement). Floating glide bar and shield assembly 32, by contrast, is stationary in the horizontal X directions, movable only in either vertical Y direction. Such directions of available movement of the parts are shown in FIG. 3. The movement in both horizontal X directions of the panel positioner bar causes movement of attached substrate 26 in such directions, which both aids in uniform surface deposition and in deposition on surfaces within through holes of circuit boards.

Shown also in FIG. 2 are areas 34A and 34B on either side of substrate 26 where sparging may be initiated. Although not drawn to scale, the sparging will occur in close proximity of substrate 26. The horizontal lines drawn in FIG. 2 from each anode 22A and 22B to substrate cathode 26 illustrate the path of ion migration from each anode to substrate cathode 26.

Floating glide bar and shield assembly 32 has two side bars 36A and 36B, each of which retains a shield, according to the present invention. Side bars 36A and 36B are spaced sufficiently from substrate 26 so that the attached shields are located substantially outside of sparging areas 34A and 34B, so that the shields will not increase the number of sparging bubbles being trapped in the substrate. Additionally, even if random sparging bubbles may happen to flow into contact with the shield despite its distant location, because floating glide bar and shield assembly 32 does not move in the horizontal X directions, the shields will not move such bubbles toward substrate 26, as in prior art approaches. The shields retained by side bars 36A and 36B in the system shown in FIG. 2 may be any known or to-be-developed shield, such as any of the three shields described below, according to the present invention.

One such shield 38, shown attached to side bar 36A, includes a plastic sheet with holes therein through which ions are allowed to flow, as described below. Another shield 40, shown attached to side bar 36B, includes a conductive element (such as a screen) charged to a positive voltage potential, which charged element repels ions flowing from anode 22B, as described below.

FIG. 3 is a diagram illustrating respective movements of floating glide bar and shield assembly 32 and panel positioner bar 30. Also shown in FIG. 3 are shields 38 attached to sidewalls 36 of floating glide bar and shield assembly 32. As shown, floating glide bar and shield assembly moves in either vertical Y direction. Panel positioner bar also moves in either vertical Y direction and also in either horizontal X direction. As described, panel positioner bar is forced downwardly against an upper surface of floating glide bar and shield assembly 32, thereby retaining floating glide bar and shield assembly 32 within the solution. Panel positioner bar 30 moves in either horizontal X direction along an upper surface of floating glide bar and shield assembly 32.

Figure 4:
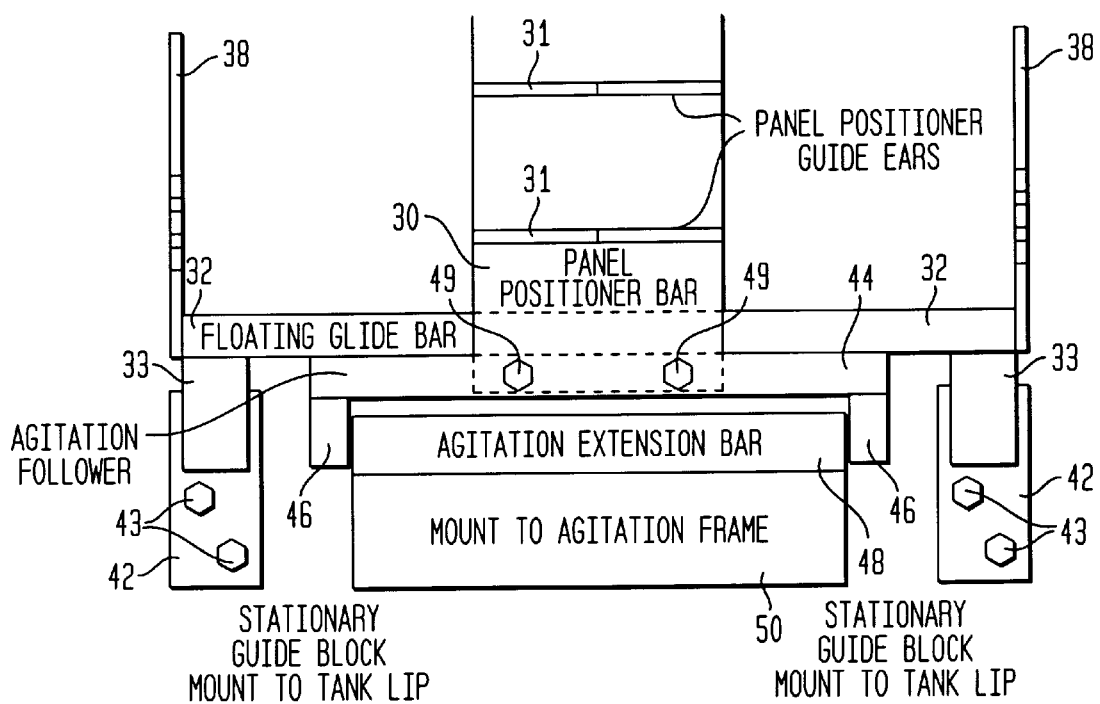
FIG. 4 is a more detailed block diagram of a portion of the electroplating device of FIG. 2 according to an embodiment of the invention.

More details of this construction are illustrated in FIG. 4. As shown, panel positioner bar 30 includes guide ears 31 which extend within vertical guides (not shown) for movement of panel positioner bar 30 in either of the vertical Y directions. Panel positioner bar 30 attaches to an agitation follower 44 which is retained on an agitation extension bar 48 by shoulders 46. Agitation extension bar 48 is attached to mount 50. Mount 50 attaches to a bar (not shown) that moves back and forth in the horizontal X directions within the tank. This back and forth motion of the bar may be accomplished through use of a motor, manual crank or other.

Floating glide bar 32 rests against shoulders 33 which attach to stationary glide block 42. Stationary glide block 42 mounts to a lip of the tank (not shown) with bolts 43. It should be appreciated that the construction of the system shown and described herein is exemplary.

Figure 5:
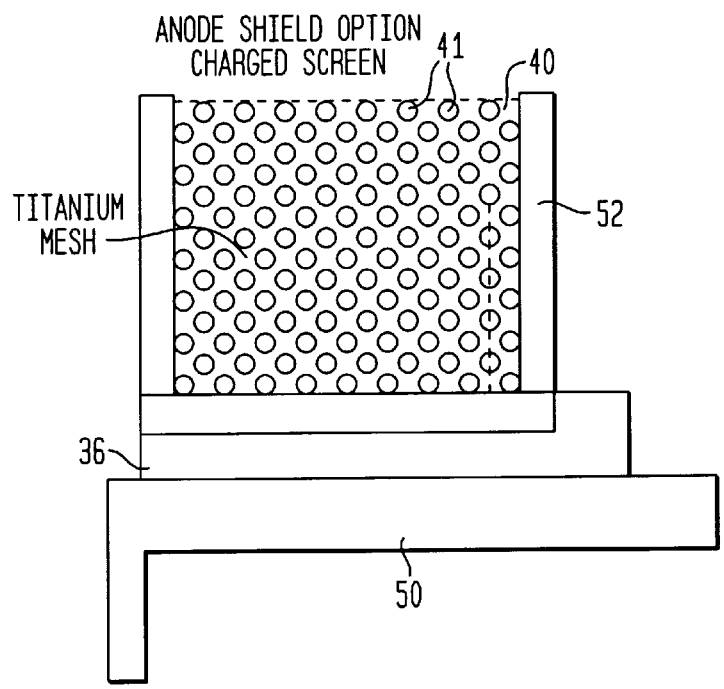
FIG. 5 is a diagram showing the charged screen shield according to an embodiment of the invention.

FIG. 5 is a diagram showing one of the shielding devices 40 according to the present invention. Shield 40 includes a conductive element, preferably a mesh or screen, attached at its sides to a frame 52. Screen 40 preferably is formed from a conductive material that does not plate well such as titanium or iridium. Frame 52 of screen 40 preferably is attached to a sidewall 36 of floating glide bar and shield assembly 32, if used in the system described in FIG. 2. Any suitable attachment mechanism such as bolting or other may be used. Multiple holes 41 are shown within screen 40.

During operation, screen 40 is charged to a voltage having the same potential (i.e., positive) as that of the anode, preferably to a voltage magnitude that is equal to or greater than that of the anode. When charged, screen 40 will repel positive ions, thereby acting as an electrical barrier or shield to ions emanating from the anode. The charging may occur by providing an electrical voltage through an insultated electrical line (not shown) that is electrically connected to the screen.

An advantageous feature of the charged screen shield embodiment includes that the applied voltage magnitude is variable and may be controllable externally of the tank. The voltage control may be manual, such as with the use of a potentiometer, may be preprogrammed to be controllable through use of a computer input device, or may be digitally controllable. The power may be provided from any voltage source such as a voltage generator.

It should be appreciated that the magnitude of the voltage applied to the charge screen will directly effect the amount of shielding that occurs. In one embodiment of the invention, it is envisioned that the potential applied to the charge screen will be periodic. In other words, a periodic voltage signal will be applied to the screen such that the voltage is "on" for a period of time and then "off" for a period of time. Such an embodiment is shown functionally in FIG. 2 in which a periodic signal, that may be applied to the screen 40, is shown beneath screen 40. The period of the applied signal and the "on" and "off" times may be altered for optimization for a particular application. When the screen is charged, it will act as an electrical barrier to the ions. When the screen is not charged, the ions will flow through holes 41 within the screen.

The controllability of the voltage applied is particularly important because substrate sizes vary and require different levels of shielding to attain even depostion distribution. The voltage may be human and/or machine (i.e., computer) controlled and to optimize the shielding for each application and electroplating process. A real-time (during electroplating) deposition measurement or analysis may take place to aid in the shielding control. Such measurement or analysis may be connected in feedback with a control device which controls the shielding level, yielding a fully automatic optimized shielding system (not shown).

Another effect of the charged screen embodiment of the invention includes that the charged screen, when charged, will accellerate ions once they have passed through the screen toward the substrate, which may aid circuit board through hole surface deposition.

Figure 6:
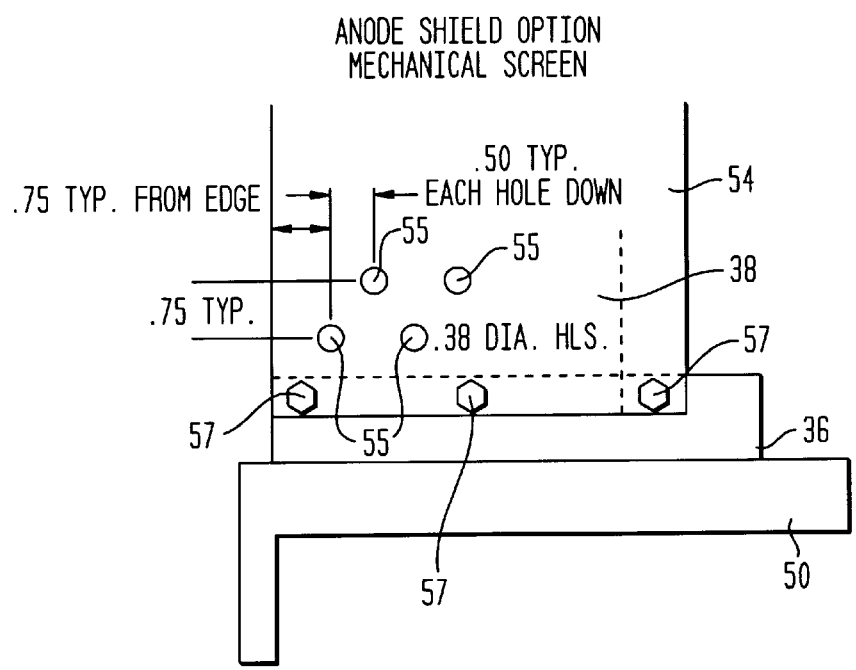
FIG. 6 is a diagram showing the holed sheet shield according to an embodiment of the present invention.

A shield according to another embodiment of the present invention is shown is FIG. 6. As shown, shield 38 includes a sheet of non-conductive, non-porous material such as polypropylene, through which holes 55 are formed. The polypropylene sheet 38 is attached at its sides to a frame 54. If the shield of FIG. 6 is used in the system of FIG. 2, then frame 54 is attached to a sidewall 36 of floating glide bar and shield assembly by any conventional means such as bolting (bolts 57 shown in FIG. 6, for example). During use, the ions are able to flow only through holes 55. The size and spacing of holes 55 control the amount of shielding attained.

The size and spacing of the holes may be selected to be dependent on application-specific characteristics such as on the surface density of the circuit board substrate. These parameters may be altered to suit a particular application or use.

Advantages to use of this shield within the system of FIG. 2 include that, because the shield is stationary in the horizontal X directions, and it is located outside of the region where sparging occurs, the shield itself will not intersect many sparging bubbles, if any, nor will the shield move any intersected sparging bubbles into an area where they may contact and be trapped by the circuit board substrate.

Additionally, because the circuit board substrate is moved back and forth in the horizontal X directions with respect to the stationary (in the horizontal X directions) shield, the trilobe effect of the prior art is either eliminated or significantly reduced. This is so because the distance between the shield and the circuit board substrate is continuously changing, first increasing, then decreasing, preferably in a constant manner. Thus, the areas of overlap (or areas where no overlapping occurs) between ions is ever-changing. As a result, more even deposition occurs.

Figure 7:
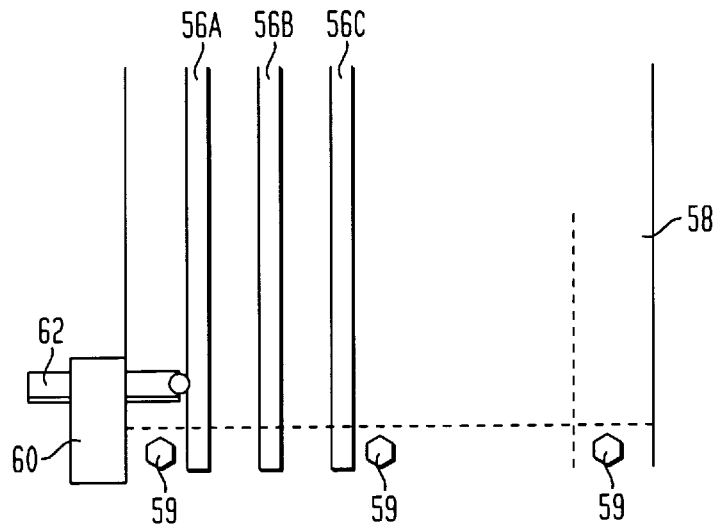
FIG. 7 is a diagram showing a shield consisting of louvers according to an embodiment of the invention.

A third embodiment of a shield according to the invention is shown in FIG. 7. As shown, the shield includes multiple louvers (only three shown) 56A, 56B and 56C, preferably connected in parallel. Each louver may be connected to a rod that extends along the longitudinal axis of the louver. One end of each louver preferably is connected to a frame 58, which, in turn, is connected to a side bar 36 of floating glide bar and shield assembly 32, if used in the system of FIG. 2. Bolts 59 may be used for such connection purpose. The louvers may extend either horizontally or vertically, or other (with respect to FIG. 2), preferably in a direction perpendicular to the lines of motion of the ions between anode walls 22A and 22B and substrate 26.

Each louver may rotate about its longitudinal axis, preferably at least 90 degrees, such that it will prevent(or significantly reduce) the flow of ions when the face of the louver is perpendicular to the path of the ions from anode to cathode and will offer little if any resistance to the flow of ions when the face of the louver is rotated 90 degrees from such position such that the face is parallel with the path flow of ions from anode to cathode.

Figure 8:
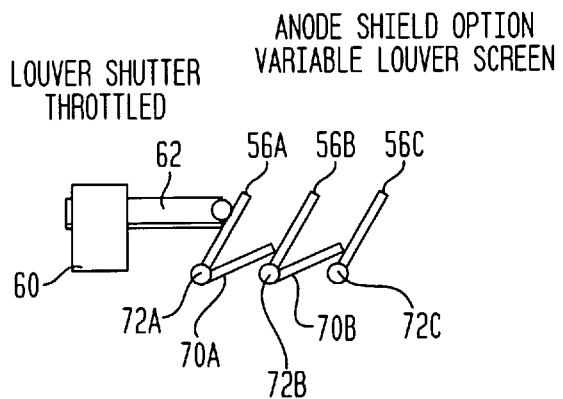
FIGS. 8 and 9 are functional block diagrams illustrating the opening and closing of the louvers according to an embodiment of the invention.
Figure 9:
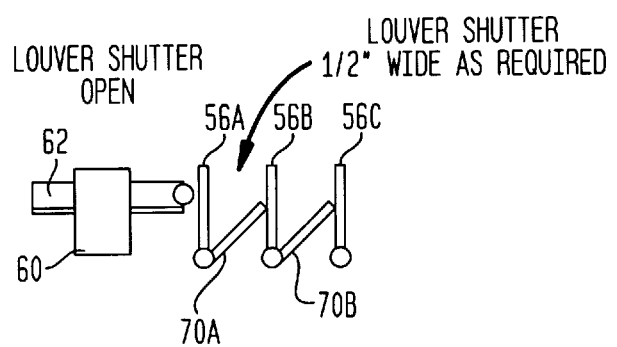

Each louver alternatively may rotate about a pivot point at an end of the louver, such as the end attached to frame 58. For this purpose, an actuator 60 is shown with a slide throttle 62 which contacts louver 56A. In this embodiment, an element such as a leaf spring, connects each pair of adjacent louvers. For example, as shown in FIGS. 8 and 9, leaf spring 70A connects louvers 56A and 56B and leaf spring 70B connects louvers 56B and 56E.

When actuator 60 causes throttle 62 to move into contact with louver 56A, louver 56A rotates about the fulcrum 72A. Leaf spring 70A, in turn, pushes against louver 56B causing louver 56B to rotate about fulcrum 72B. Leaf spring 70B pushes against louver 56C cause louver 56C to rotate about fulcrum 72C. Such a rotated arrangement ("closed" position, as shown in FIG. 8) may cause the louvers to prevent (or significantly reduce) the flow of ions from anode to cathode, assuming the flow path is parallel to the longitudinal axes of the louvers when in their "open" position (as shown in FIG. 9). When actuator 60 causes throttle 62 to return to the position in which it does not press against louver 56A, then louvers 56A, 56B and 56C will return to their at rest open position. For this purpose, the louvers maybe spring-loaded.

Each louver preferably is flat and has a width within the range of 1/16 to 5/16 inch and a length within the range of 1/2 to 2 inches and is made from a non-porous, non-conductive material such as polypropylene. The construction and exact location of the louvers is not critical. The louvers may extend vertically, horizontally, or other with respect to the tank construction shown in FIG. 2.

The opening and closing of the louvers preferably is controllable either manually or electrically. Thus, the level of shielding is controllable.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto what is claimed is:

1. An electroplating system comprising:

a tank for holding an electrolytic bath solution;

an anode having a surface with a longitudinal axis within the tank;

a shield assembly positioned within the tank adjacent the anode and comprising at least one shield attached to a glide bar;

a substrate cathode assembly comprising a substrate panel positioner bar adapted to support a substrate cathode, the substrate panel positioner bar being positioned to contact a surface of the glide bar and being movable along said glide bar toward and away from the anode surface along a second axis substantially perpendicular to said longitudinal axis; and means for applying a first voltage having a first potential to said anode and a second voltage having a second potential, opposite to that of the first potential, to the substrate cathode assembly;

wherein said shield assembly is stationary in the directions along the second axis.

2. The system as claimed in claim 1 wherein the shield is located closer to the anode than to the substrate cathode assembly.

3. The system as claimed in claim 1 wherein the substrate cathode assembly is movable into and out from the tank.

4. The system as claimed in claim 1 wherein the glide bar is buoyant and is retained within the solution by a downward force of the panel positioner bar.

5. The system as claimed in claim 1 further comprising sparging means which define an area of sparging within the tank and wherein the shield is sufficiently spaced from the substrate cathode assembly such that the shield is substantially outside the area of sparging.

6. The system as claimed in claim 1 wherein the shield includes a non-conductive plate having holes formed therein.

7. The system as claimed in claim 1 wherein the shield includes at least one louver.

8. The system as claimed in claim 7 wherein a physical orientation of the louver is controllably adjustable.

9. The system as defined in claim 1 wherein the shield includes a conductive screen element the system further comprising means for applying a third voltage having the first potential to the conductive screen element.

10. The system as claimed in claim 9 wherein a magnitude of the third voltage is controllable.

11. The system as claimed in claim 9 wherein a magnitude of the third voltage is controllable externally of the tank.

12. The system as claimed in claim 9 wherein the third voltage is pulsed on and off.

13. The system as claimed in claim 1 further comprising means for varying the level of shielding provided by the shield.

14. A shielding method for use in an electroplating system, comprising the steps of providing a tank that holds an electrolytic bath solution and an anode having a surface with a longitudinal axis located at least partially in the solution within the tank;

positioning a shield assembly which comprises at least one shield attached to a glide bar within the tank adjacent the anode;

positioning a substrate cathode assembly comprising a substrate panel positioner bar which supports a substrate cathode, so that the substrate panel positioner bar contacts a surface of the glide bar moving the positioner bar along said glide bar toward and away from the anode surface along a second axis substantially perpendicular to said longitudinal axis, the shield assembly remaining stationary in the directions along the second axis; and applying a first voltage having a first potential to said anode and a second voltage having a second potential, opposite to that of the first potential, to the substrate cathode assembly; and controlling a level of shielding provided by the shield.

15. The method as claimed in claim 14 wherein the step of controlling includes a step of controlling a physical orientation of at least one louver.

16. The method as claimed in claim 14 wherein the step of controlling includes a step of controlling a voltage applied to a conductive shield.

17. The method as claimed in claim 14 wherein the step of controlling includes a step of changing the physical orientation of the shield.

* * * * *